United States Patent
Lin et al.

(10) Patent No.: US 9,590,032 B2
(45) Date of Patent: Mar. 7, 2017

(54) FIN-FET DEVICE AND MANUFACTURING METHOD THEREOF

(71) Applicant: TAIWAN SEMICONDUCTOR MANUFACTURING CO., LTD., Hsinchu (TW)

(72) Inventors: Chih-Han Lin, Hsinchu (TW); Jr-Jung Lin, Hsinchu (TW); Ming-Ching Chang, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/569,336

(22) Filed: Dec. 12, 2014

(65) Prior Publication Data
US 2016/0172439 A1 Jun. 16, 2016

(51) Int. Cl.
*H01L 29/66* (2006.01)
*H01L 27/02* (2006.01)
*H01L 29/06* (2006.01)
*H01L 29/78* (2006.01)

(52) U.S. Cl.
CPC .... *H01L 29/0642* (2013.01); *H01L 29/66795* (2013.01); *H01L 29/785* (2013.01)

(58) Field of Classification Search
CPC ......... H01L 29/66734; H01L 29/66795; H01L 29/785; H01L 29/7813; H01L 29/4236; H01L 29/42368; H01L 29/4238; H01L 29/0207; H01L 29/0696; H01L 29/1095; H01L 27/02; H01L 27/0207
USPC .......................... 257/401, 622; 438/268–270
See application file for complete search history.

(56) References Cited

U.S. PATENT DOCUMENTS

| | | | |
|---|---|---|---|
| 8,614,127 B1 * | 12/2013 | Yang | ................ H01L 29/66795 257/E21.429 |
| 2014/0231924 A1 * | 8/2014 | Kuo | ...................... H01L 29/785 257/401 |
| 2015/0279947 A1 * | 10/2015 | Waldron | ................. H01L 29/04 257/401 |

* cited by examiner

*Primary Examiner* — Monica D Harrison
(74) *Attorney, Agent, or Firm* — Maschoff Brennan

(57) ABSTRACT

A fin-like field-effect transistor (Fin-FET) device includes a substrate, a fin structure disposed on the substrate, and an isolation structure disposed adjacent to the fin structure. The fin structure includes a recessed structure, which a bottom of the recessed structure is below a top surface of the isolation structure.

19 Claims, 19 Drawing Sheets

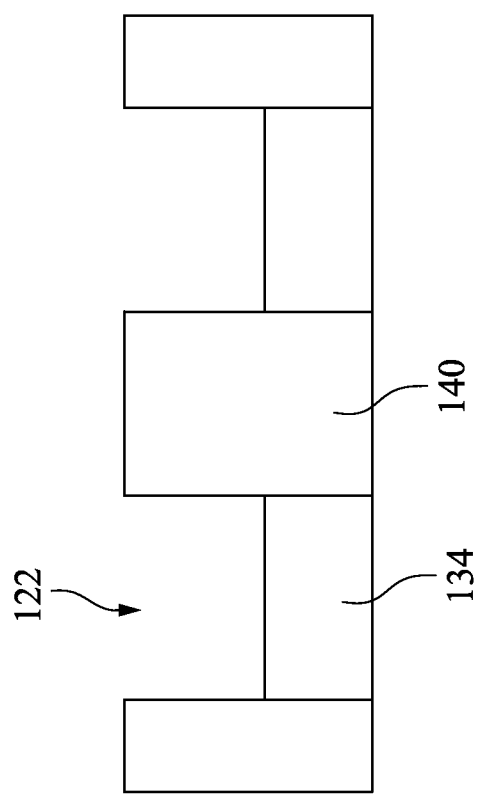

FIN-FET DEVICE AND MANUFACTURING METHOD THEREOF

BACKGROUND

The semiconductor integrated circuit (IC) industry has experienced rapid growth. Over the course of the growth, functional density of the semiconductor devices has increased with the decrease of device feature size or geometry. The scaling down process generally provides benefits by increasing production efficiency, reducing costs, and/or improving device performance, but the other hand increases complexity of the IC manufacturing processes.

To address the increase of manufacturing complexity, similar advances in IC processing and manufacturing are necessary. For example, in pursuit of higher device density, the continuing decrease in technology nodes has lead to a desire to replace a typical polysilicon gate electrode with a metal gate electrode to improve device performance. Also, a three dimensional transistor, such as a fin-like field-effect transistor (Fin-FET), has been introduced to replace a planar transistor. In the manufacturing process of the Fin-FET devices, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A to 9A are cross-sectional views of the Fin-FET device in FIG. 1A along the line AA at an intermediate stage of fabrication, in accordance with various embodiments.

FIGS. 2B to 9B are cross-sectional view of the Fin-FET device in FIG. 1A along the line BB at an intermediate stage of fabrication, in accordance with various embodiments.

DETAILED DESCRIPTION

Figure 1A:
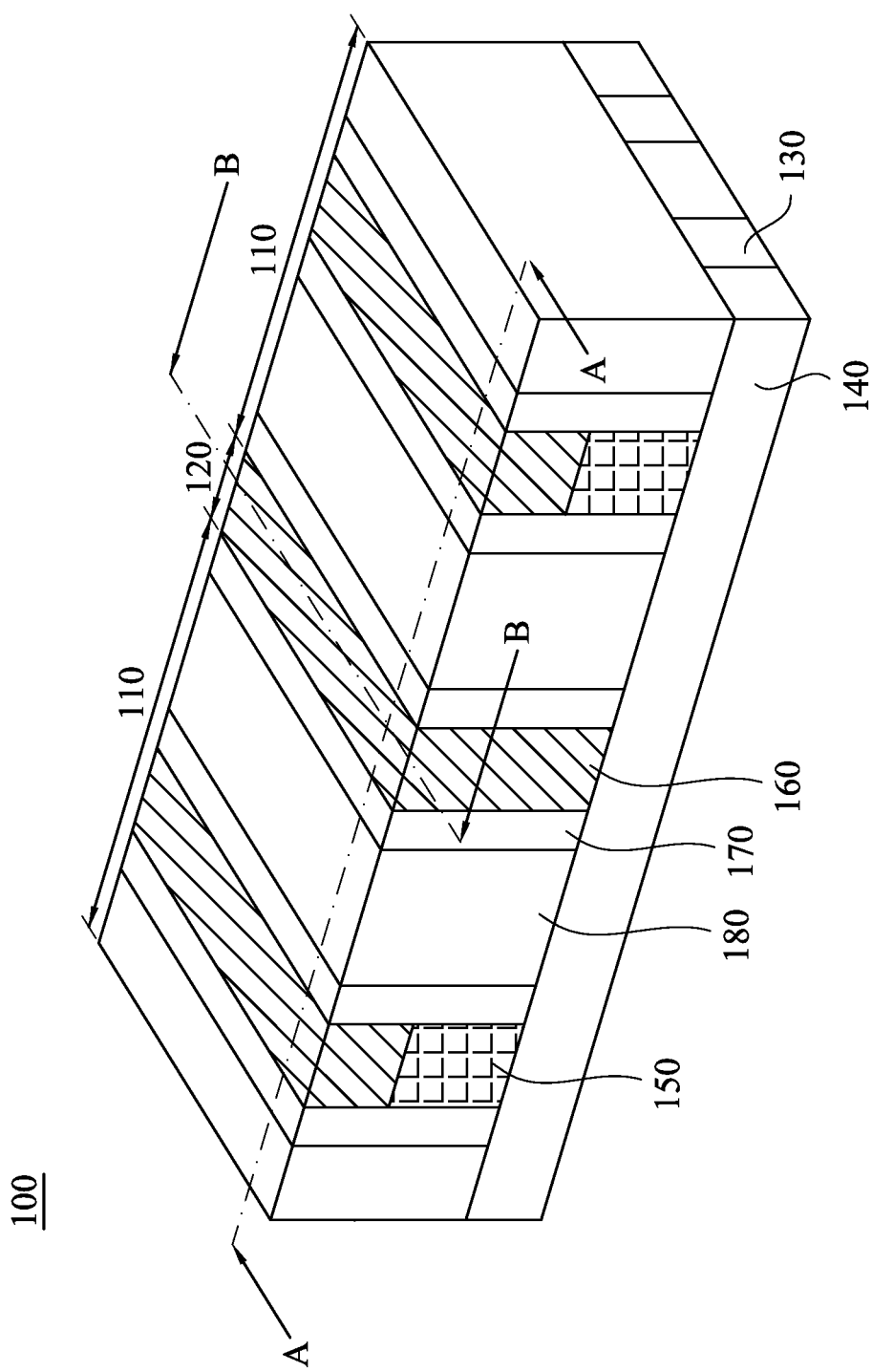
FIG. 1A is a Fin-FET device, in accordance with various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Generally, dummy gate stacks are replaced with high-k/metal gate (HK-MG) stacks during the process of fabricating a Fin-FET device, and a channel-isolation region is formed to electrically separate active regions in the Fin-FET device. The process starts with applying a first photoresist to define the channel-isolation region, and an etching process is applied to remove the dummy gate stack and the fin structure in the channel-isolation region to form a gate trench. A passivation layer is deposited to fill the gate trench, and a first chemical mechanical polish (CMP) process is applied to remove excessive passivation layer. After that, the dummy gate stacks in the active regions are replaced with the HK-MG stacks. However, it is also necessary to form the passivation layer in the active regions for protecting the HK-MG stacks, and thus a second photoresist is applied to etch a portion of the HK-MG stacks. The passivation layer should be deposited again to cover the HK-MG stacks and accompanied with a second CMP process to remove excessive passivation layer.

As aforementioned, the passivation layer is deposited twice and accompanied with two CMP processes. Besides, extra photoresist is necessary for etching the portion of the HK-MG stacks in the active regions. Therefore, extra costs for deposition process, CMP process and photoresist significantly decrease the efficiency of the Fin-FET device fabrication process.

Figure 1B:
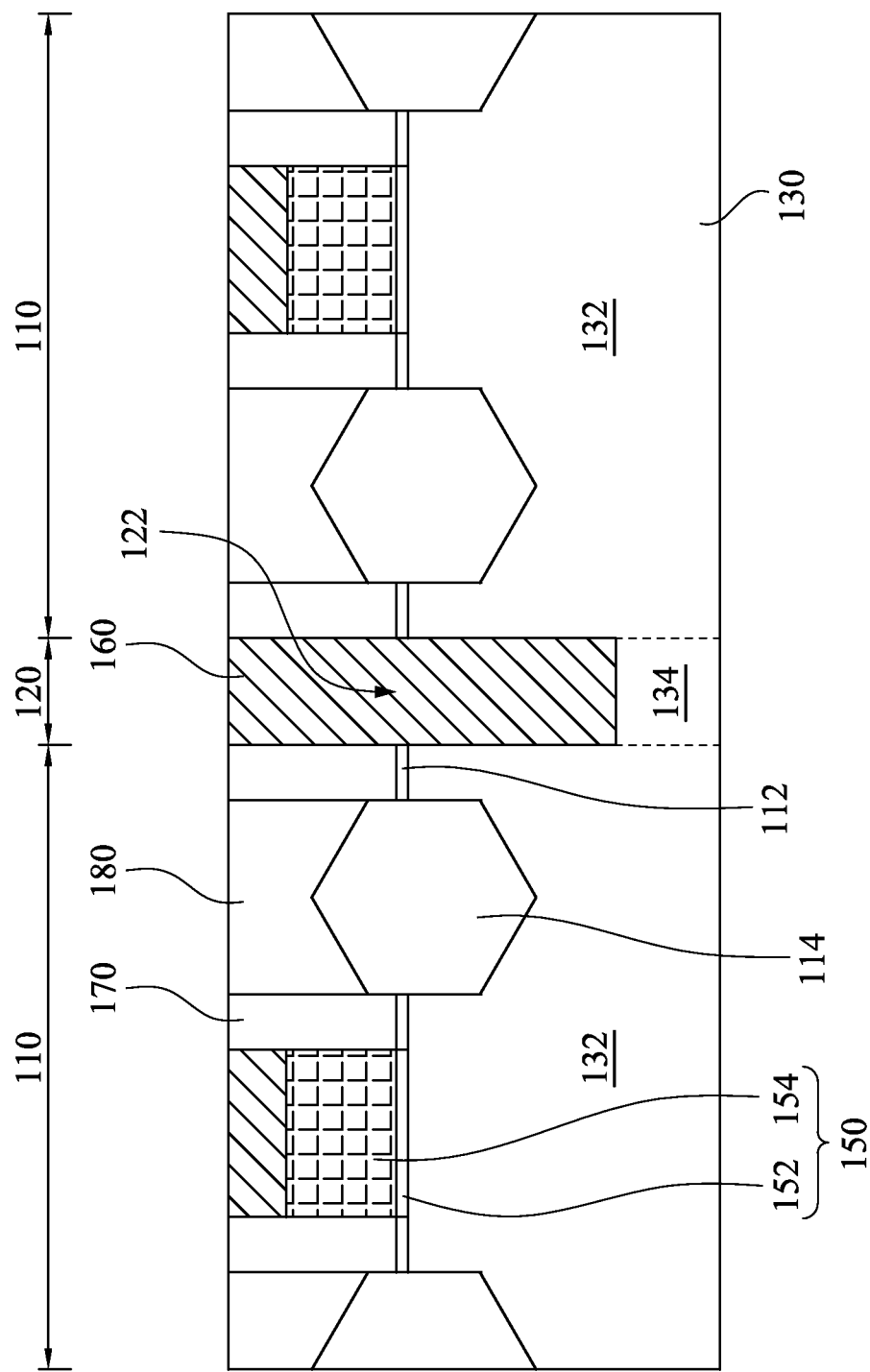
FIG. 1B is a cross-sectional view of the Fin-FET device in FIG. 1A along the line AA, in accordance with various embodiments.
Figure 1C:
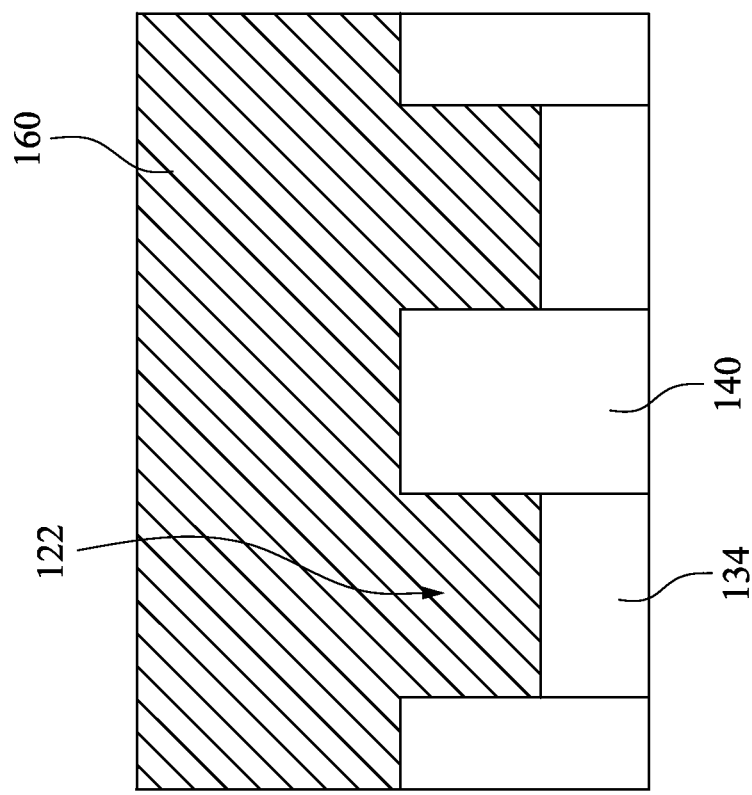
FIG. 1C is a cross-sectional view of the Fin-FET device in FIG. 1A along the line BB, in accordance with various embodiments.

The present disclosure provides a method of manufacturing the Fin-FET device without extra deposition process, CMP process and photoresist. Please refer to FIG. 1A-1C at the same time. FIG. 1A is a Fin-FET device in accordance to various embodiments of the present disclosure; FIG. 1B is a cross-sectional view of the Fin-FET device in FIG. 1A along the line AA, in accordance with various embodiments; and FIG. 1C is a cross-sectional view of the Fin-FET device in FIG. 1A along the line BB, in accordance with various embodiments. As shown in FIG. 1A, a fin field-effect transistor (Fin-FET) device 100 includes two active regions 110 and a channel-isolation region 120 interposed between the two active regions 110, which the channel-isolation region 120 electrically isolates the two active regions 110. A plurality of fin structures 130 are fabricated in a substrate (not shown), and isolation structures 140 separate the adjacent fin structures 130. The active region 110 includes a high-k/metal gate (HK-MG) stack 150 and a passivation layer 160 covering the HK-MG stack 150. Besides, the HK-MG stack 150 and the passivation layer 160 are interposed between two sidewall spacers 170, and an interlayer dielectric (ILD) layer 180 is disposed to protect the internal structures of the Fin-FET device 100. More specifically, the ILD layer 180 and the HK-MG stack 150 are on opposite sides of the sidewall spacer 170, which the ILD layer 180 is interposed between two sidewall spacers 170. It is worth noting that there is no HK-MG stack 150 in the channel-isolation region 120, which is only filled with the passivation layer 160.

Please referring to FIG. 1B to further clarify the internal structures in the Fin-FET device 100. More specifically, FIG. 1C is a cross-sectional view along the fin structure 130, in accordance with various embodiments. As shown in FIG. 1B, the fin structure 130 includes a first portion 132 in the active region 110 and a second portion 134 in the channel-isolation region 120, which the second portion 134 of the fin structure 130 includes a recessed structure 122. In the active region 110, the HK-MG stack 150 is disposed on the first portion 132 of the fin structure 130, which the HK-MG stack 150 includes a metal gate 152 and a high-k dielectric layer 154 interposed between the metal gate 152 and the first portion 132 of the fin structure 130. Furthermore, a gate oxide 112 is interposed between the first portion 132 of the fin structure 130 and the sidewall spacers 170, and epitaxial structures 114 are positioned at opposite sides of the HK-MG stack 150. A portion of the epitaxial structure 114 is buried in the first portion 132 of the fin structure 130, and the ILD layer 180 covers another portion of the epitaxial structure 114. The epitaxial structures 114 act as source/drain regions of the Fin-FET device 100.

In the channel-isolation region 120, the second portion 134 of the fin structure 130 includes a recessed structure 122 thereon, and the passivation layer 170 is disposed on the second portion 134 of the fin structure 130 and filling the channel-isolation region 120. In embodiments, the recessed structure 122 has a symmetrical profile.

Figure 2A:
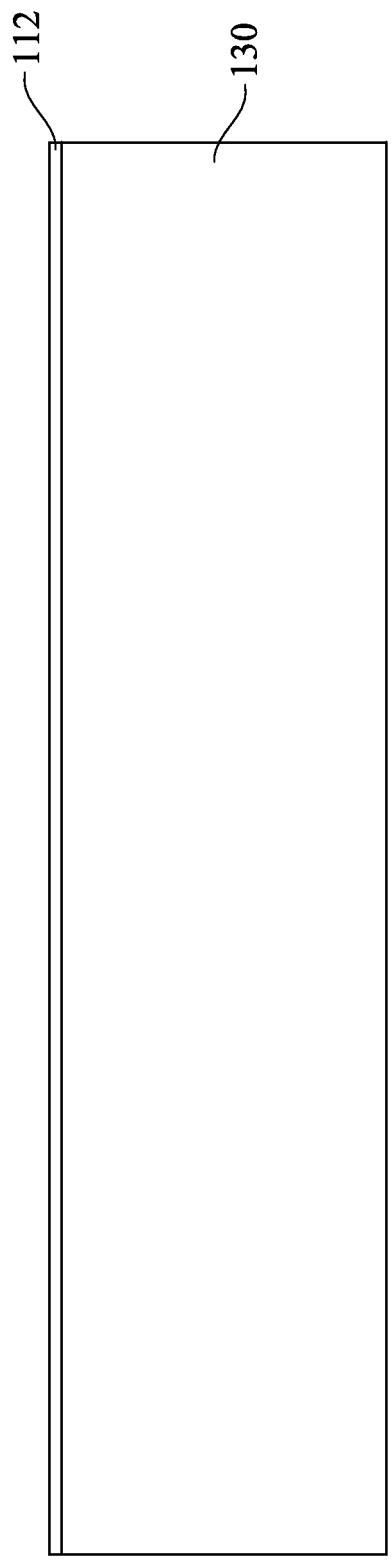

Please referring to FIG. 1C to further clarify the internal structures in the Fin-FET device 100. More specifically, FIG. 2C shows a cross-sectional view of the channel-isolation region 120. As aforementioned, the second portion 134 of the fin structure 130 includes the recessed structure 122. As shown in FIG. 1C, a bottom of the recessed structure 122 is below a top surface of the isolation structures 140. Further, the passivation layer 170 is disposed on the second portion 134 of the fin structure 130 and filling the channel-isolation region 120. In embodiments, the bottom of recessed structure 122 is in a range from about 1 angstrom to about 2000 angstroms below the top surface of the isolation structure 140. In various embodiments, the bottom of recessed structure 122 is in a range from about 100 angstrom to about 200 angstroms below the top surface of the isolation structure 140.

The present disclosure provides a method of manufacturing Fin-FET device. Please refer to FIG. 2A to 9A and FIG. 2B to 9B at the same time. FIG. 2A to 9A are cross-sectional views of the Fin-FET device in FIG. 1A along the line AA at an intermediate stage of fabrication, in accordance with various embodiments. FIG. 2B to 9B are cross-sectional view of the Fin-FET device in FIG. 1A along the line BB at an intermediate stage of fabrication, in accordance with various embodiments.

Figure 3A:
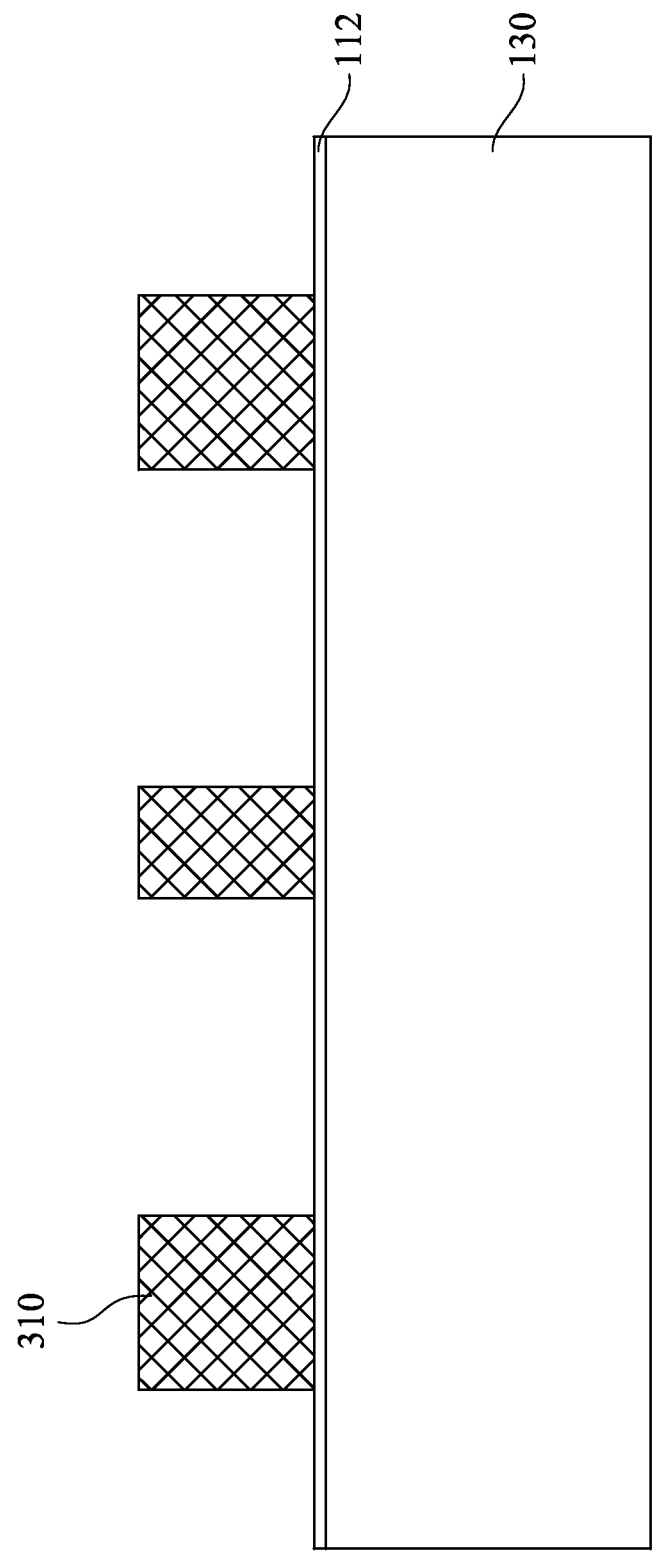
Figure 3B:
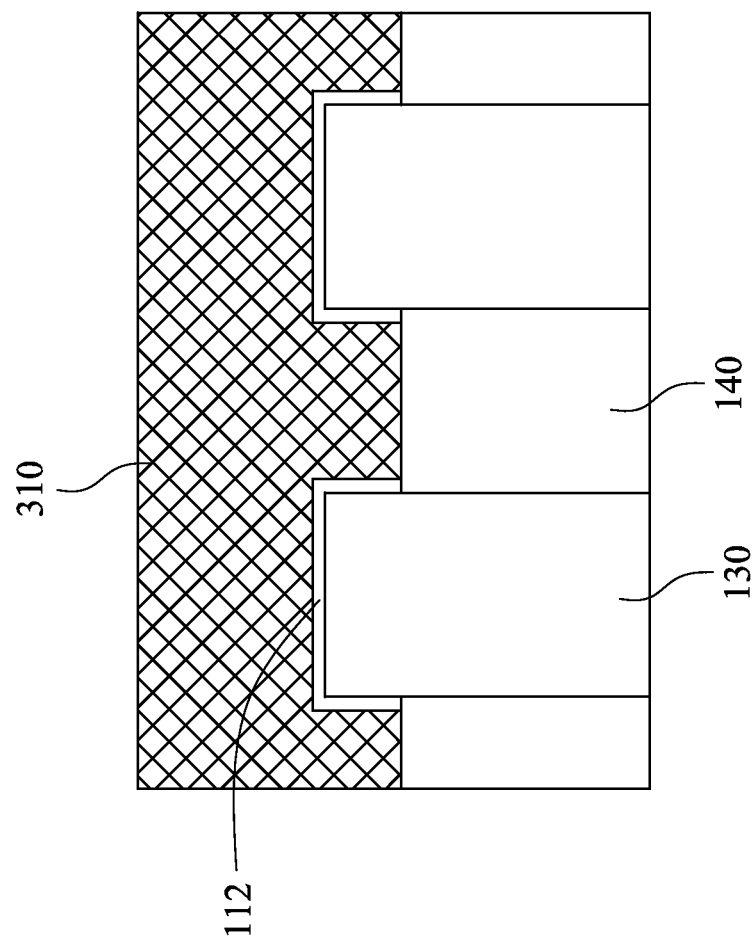

Please refer to FIGS. 3A and 3B at the same time, a substrate (not shown) is provided, and a plurality of fin structures 130 are formed from the substrate. The substrate may be a bulk silicon substrate. Alternatively, the substrate may include an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof.

In embodiments, the substrate is a silicon-on-insulator (SOI) substrate. The SOI substrate is fabricated using separation by implantation of oxygen (SIMOX), wafer bonding, and/or other suitable methods, and an exemplary insulator layer may be a buried oxide layer (BOX).

Continuing in FIGS. 3A and 3B, the fin structures 130 may be fabricated in the substrate using suitable processes including photolithography and etch processes. The photolithography process may include forming a photoresist layer (not shown) overlying the substrate, exposing the photoresist layer to form a pattern, performing post-exposure bake processes, and developing the pattern to form a masking element. The masking element mentioned above is used to protect portions of the substrate while forming trenches in the substrate by the etching process, leaving the extending fin structures 130. Numerous other embodiments of methods to form the fin structures 130 in the substrate 110 may be suitable. In embodiments, source and drain regions may be formed at two opposite ends of the fin structures 130. A channel region is between the source and drain regions, which the source and drain regions may be formed by any suitable method, such as growing by selective epitaxy.

Figure 2B:
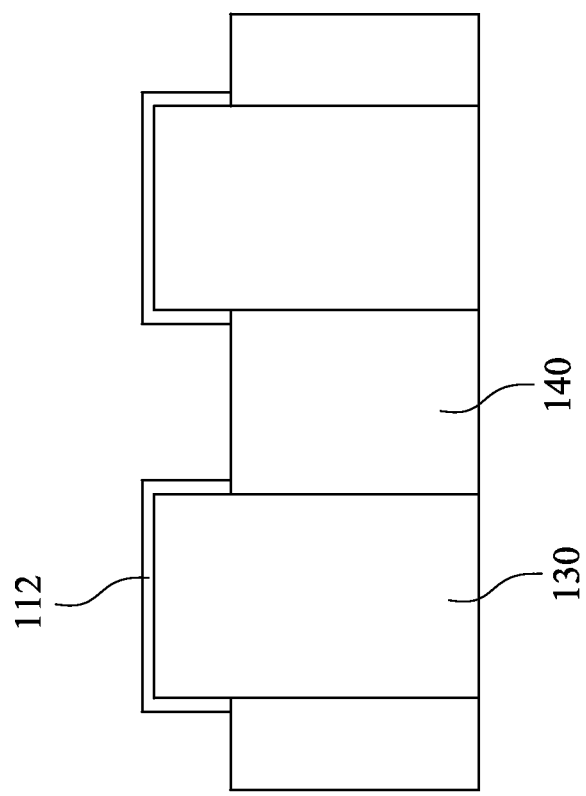

As shown in FIG. 2B, isolation structures 140 are formed on the substrate, and a gate oxide 112 is formed to cover a top surface and sidewalls of the fin 130. The isolation structures 140 are formed to separate adjacent fins 130. In embodiments, the gate oxide 112 also covers the top surface of the isolation structures 140.

The isolation structures 140 may be a single layer or a multi-layer structure. In embodiments, the isolation structures 140 may be formed of silicon oxide, silicon nitride, silicon oxynitride, fluoride-doped silicate glass (FSG), a low-k dielectric material, and/or other suitable insulating materials. In various embodiments, the isolation structures 140 may be a shallow trench isolation (STI) feature and formed by etching trenches in the substrate, filling isolating material in the trenches, and performing a chemical mechanical polish (CMP) process. Other techniques for fabricating the isolation structures 140 are possible.

The gate oxide 112 functions as an etching stop layer, which could be fabricated by thermal oxidation, chemical vapor deposition (CVD) or sputter. Other techniques for fabricating the gate oxide 112 are possible. In some embodiments, the gate oxide 112 may include a dielectric material including hafnium oxide, titanium nitride, silicon dioxide, silicon nitride, silicon oxynitride, or combination thereof.

Referring to FIGS. 3A and 3B, a dummy gate stack 310 is deposited over the fin structures 130, which the dummy gate stack 310 covers a top surface and sidewalls of the fin structures 130. The dummy gate stack 310 is formed of polycrystalline-silicon (poly-Si), poly-crystalline silicon germanium (poly-SiGe), silicon nitride, or other suitable materials. The dummy gate stack 310 is formed by a suitable procedure including deposition and patterning. The patterning process further includes lithography and etching. In various examples, the deposition includes chemical vapor deposition (CVD), physical vapor deposition (PVD), atomic layer deposition (ALD), thermal oxidation, other suitable techniques, or a combination thereof. The lithography process includes photoresist (or resist) coating (e.g., spin-on coating), soft baking, mask aligning, exposure, post-exposure baking, developing the photoresist, rinsing, drying (e.g., hard baking), other suitable processes, and/or combinations thereof. The etching process includes dry etching, wet etching, and/or other etching methods (e.g., reactive ion etching). The dummy gate stacks 310 are replaced later with a high-k dielectric layer (HK) and metal gate electrode (MG)

after high thermal temperature processes, such as thermal annealing for S/D activation during the sources/drains formation.

Figure 4A:
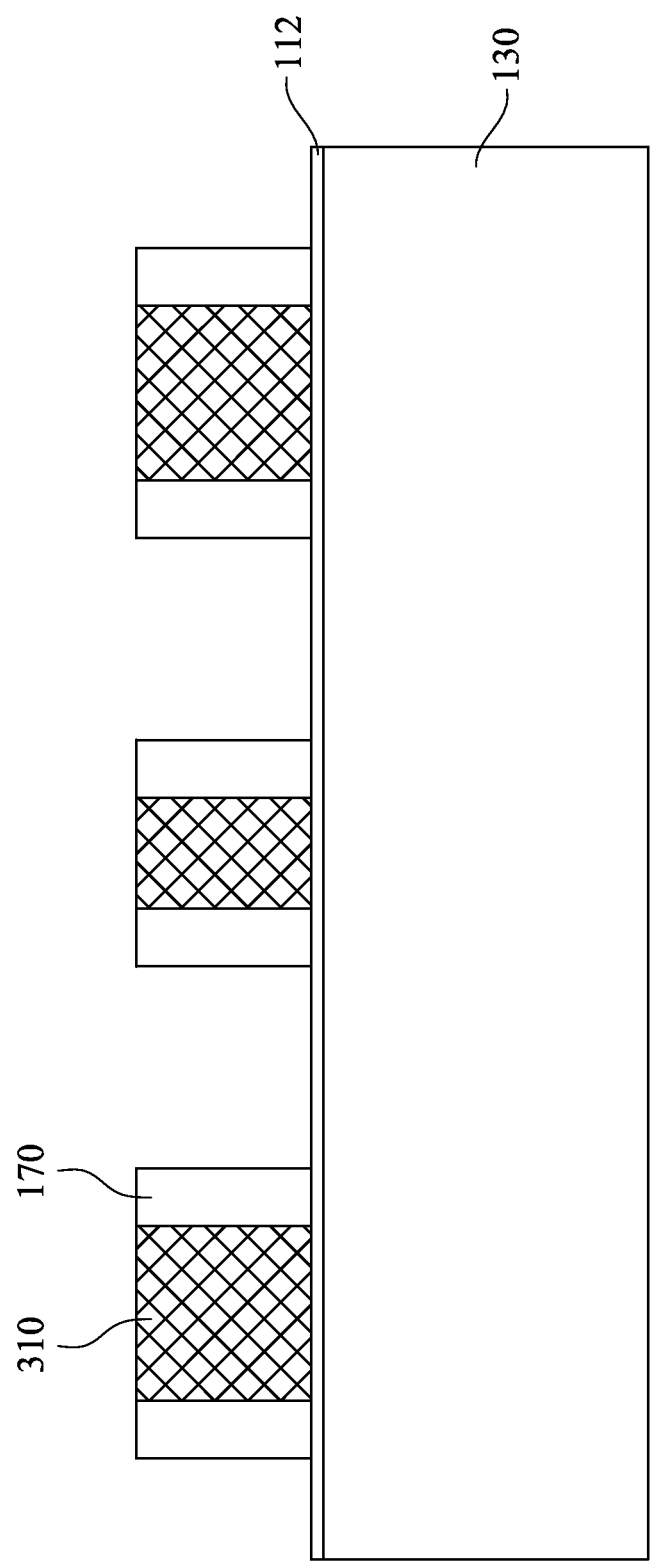
Figure 4B:
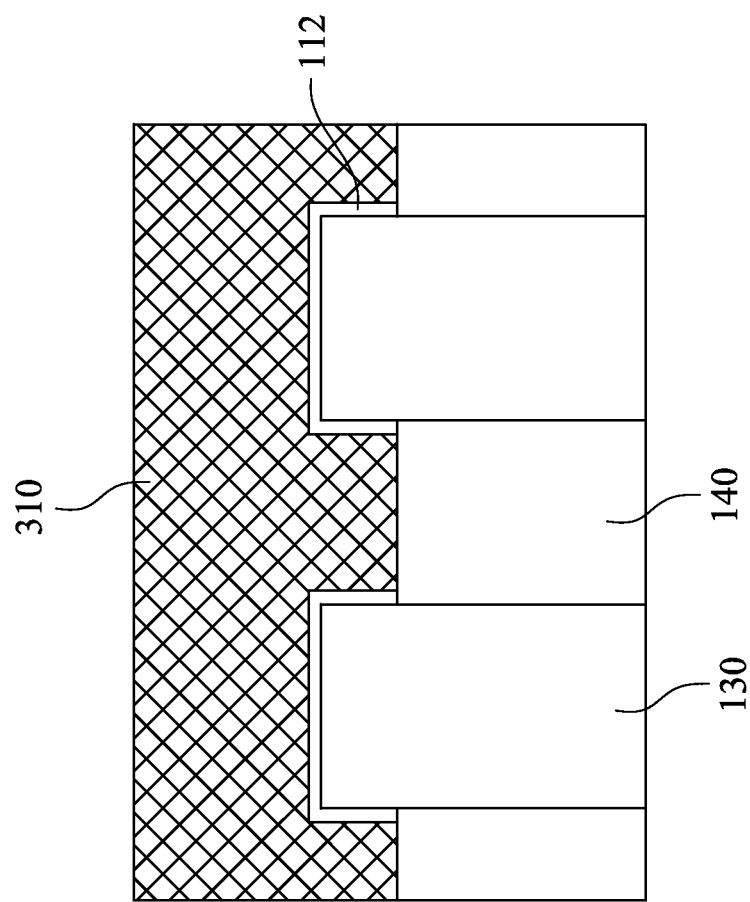

Continuing in FIGS. 4A and 4B, sidewall spacers 170 are formed on the sidewalls of the dummy gate stack 310. The sidewall spacers 170 are formed on both sides of the dummy gate stack 310, which is interposed between two sidewall spacers 170. In embodiments, the sidewall spacers 170 may include a dielectric material such as silicon oxide, silicon nitride, silicon carbide, silicon oxynitride, or combinations thereof. Typical formation methods for the sidewall spacers 170 include depositing a dielectric material over the dummy gate stack 310 and then anisotropically etching back the dielectric material. The etching back process may include a multiple-step etching to gain etch selectivity, flexibility and desired overetch control.

Figure 5A:
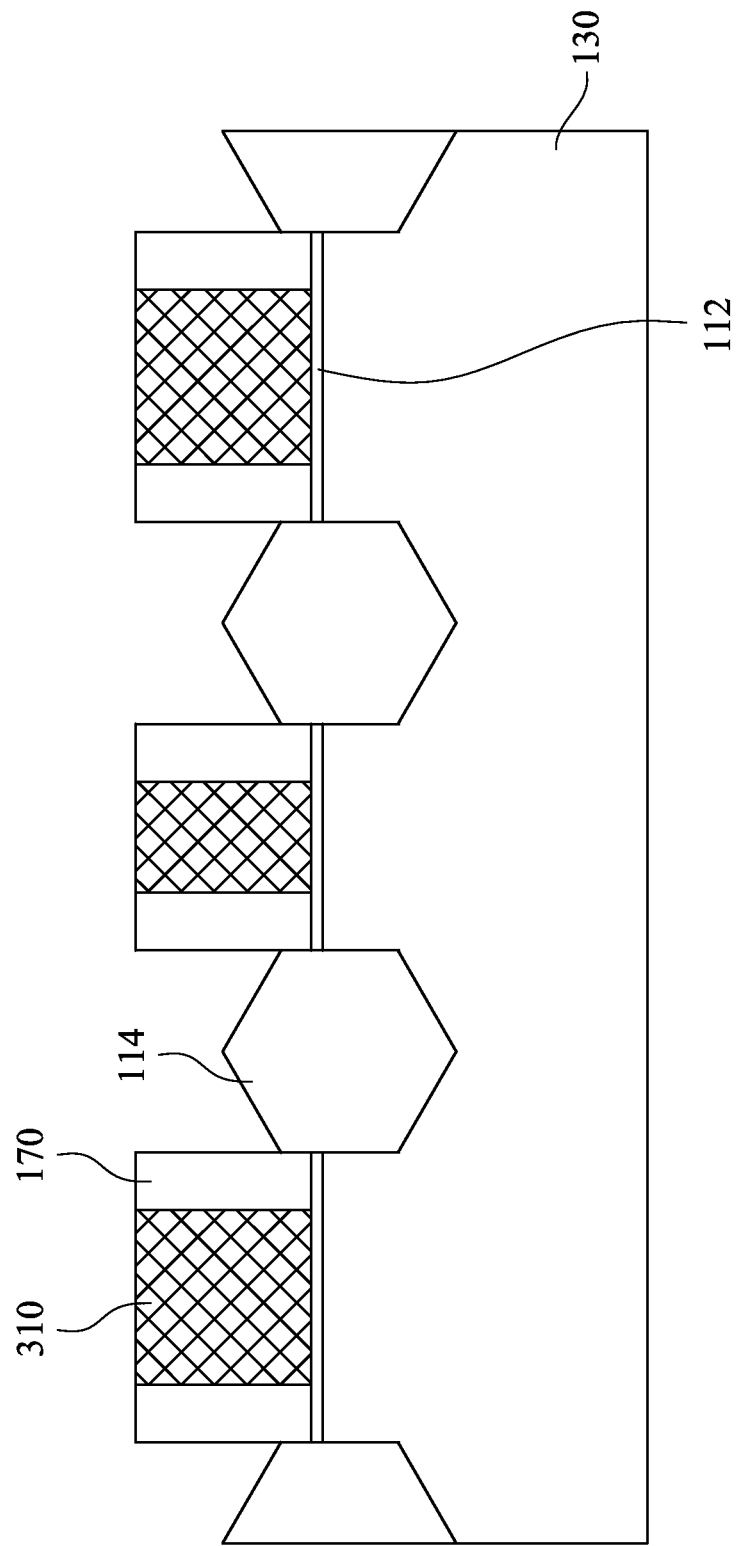
Figure 5B:
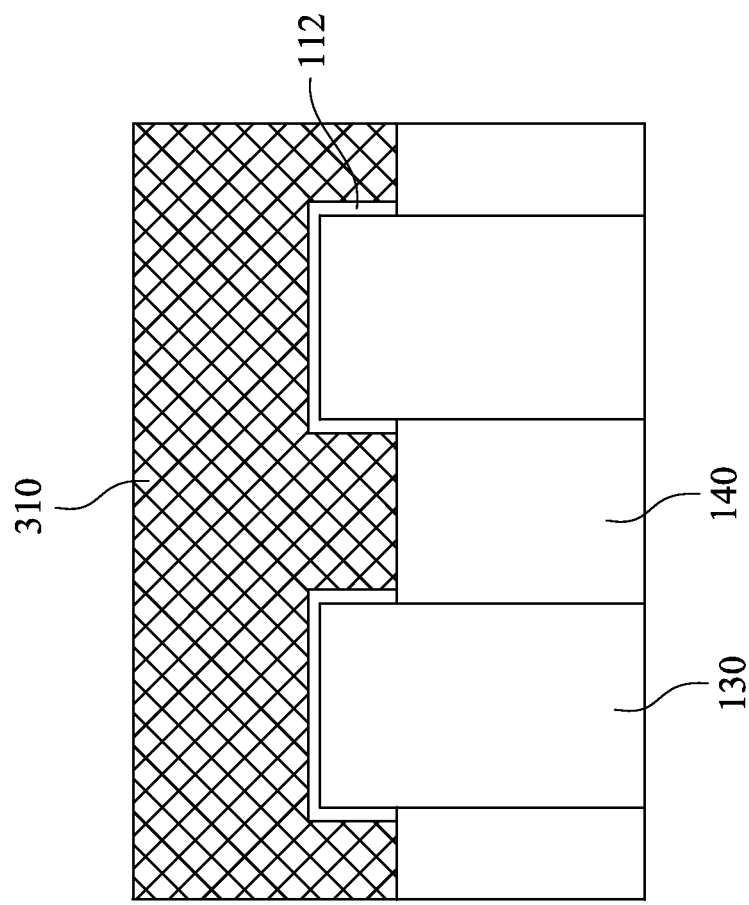

Continuing in FIGS. 5A and 5B, epitaxial structures 114 are formed in the fin structures 130. A recessing process is applied to etch the fin structure 130 and forms a plurality of cavities (not shown). Also, a portion of the gate oxide 112 on the fin structure 130 is also etched. The recessing process may include dry etching process, wet etching process, and/or combination thereof. The recessing process may also include a selective wet etch or a selective dry etch. A wet etching solution includes a tetramethylammonium hydroxide (TMAH), a $HF/HNO_3/CH_3COOH$ solution, or other suitable solution. The dry and wet etching processes have etching parameters which could be tuned, such as etchants used, etching temperature, etching solution concentration, etching pressure, source power, RF bias voltage, RF bias power, etchant flow rate, and other suitable parameters. For example, a wet etching solution may include $NH_4OH$, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etching gasses include CF4, NF3, SF6, and He. Dry etching may also be performed anisotropically using such mechanisms as DRIE (deep reactive-ion etching).

The epitaxial structures 114 may be formed in the cavities by epitaxially growing a semiconductor material including single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). In embodiments, the epitaxial structures 114 may be formed by CVD deposition techniques, e.g., vapor-phase epitaxy (VPE) and/or ultra-high vacuum CVD (UHV-CVD), molecular beam epitaxy, and/or other suitable processes.

Figure 6A:
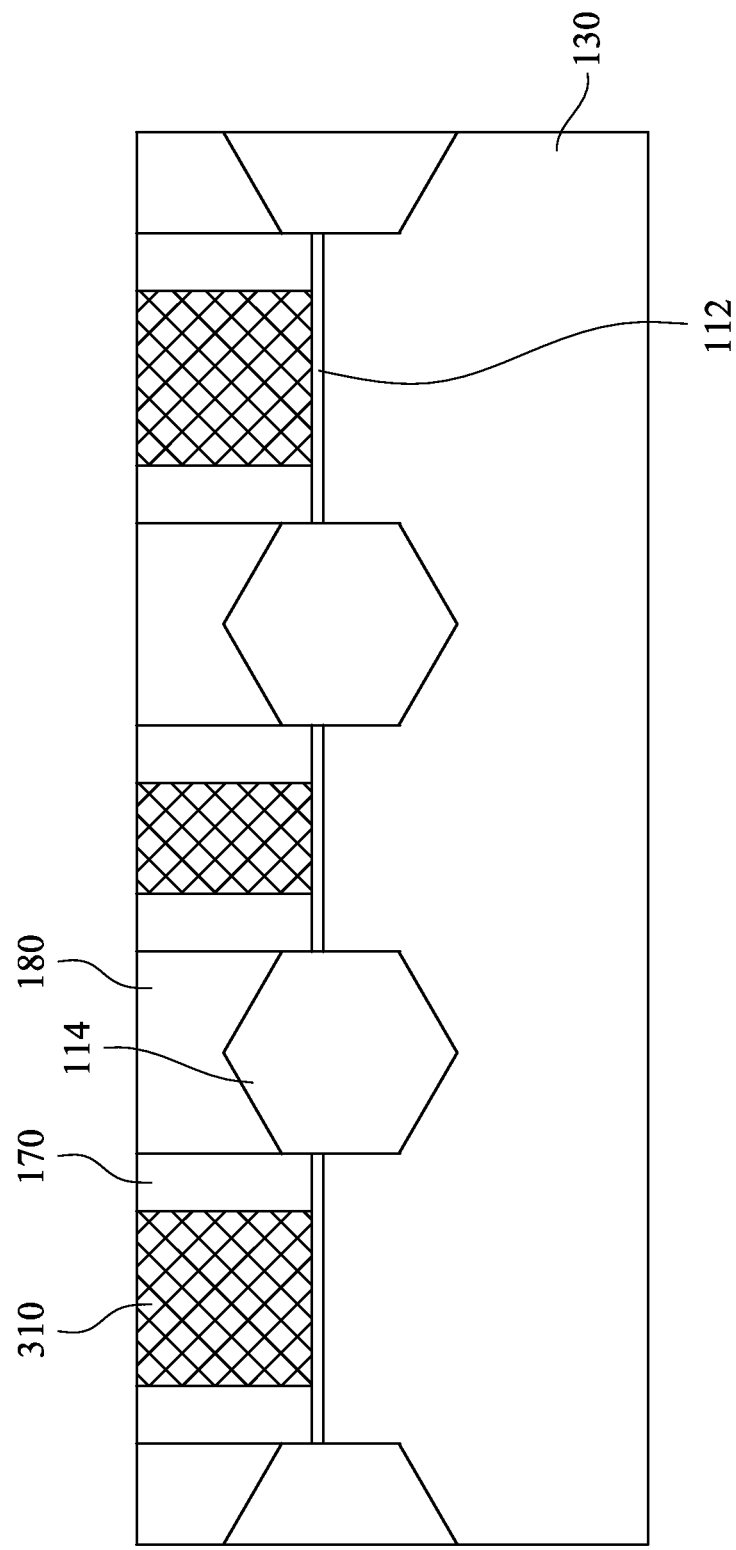
Figure 6B:
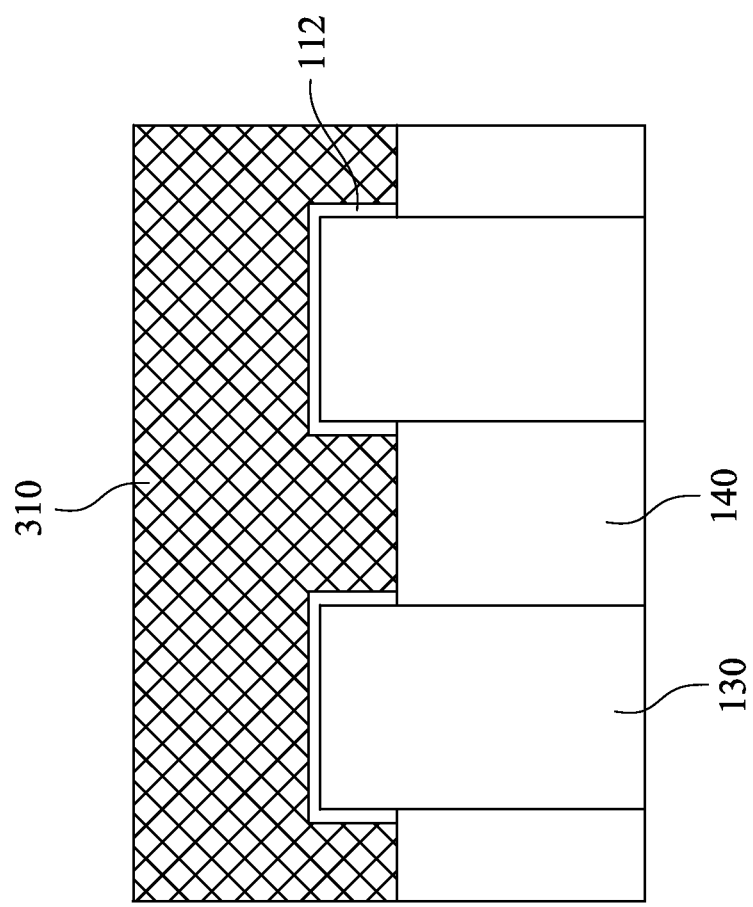

Continuing in FIG. 6A and FIG. 6B, an interlayer dielectric (ILD) layer 180 is formed to cover the epitaxial structures 114. The dielectric (ILD) layer 180 is formed on the epitaxial structures 114 and filling the gaps between the dummy gate stacks 310. The ILD layer 180 includes silicon oxide, silicon oxynitride, low k dielectric material or other suitable dielectric materials. The ILD layer 180 is formed by a suitable technique, such as CVD, ALD and spin-on-glass (SOG). In embodiments, a chemical mechanical polishing (CMP) process may be performed thereafter to remove excessive ILD layer 180 and planarize the top surface of the FinFET device 100.

Figure 7A:
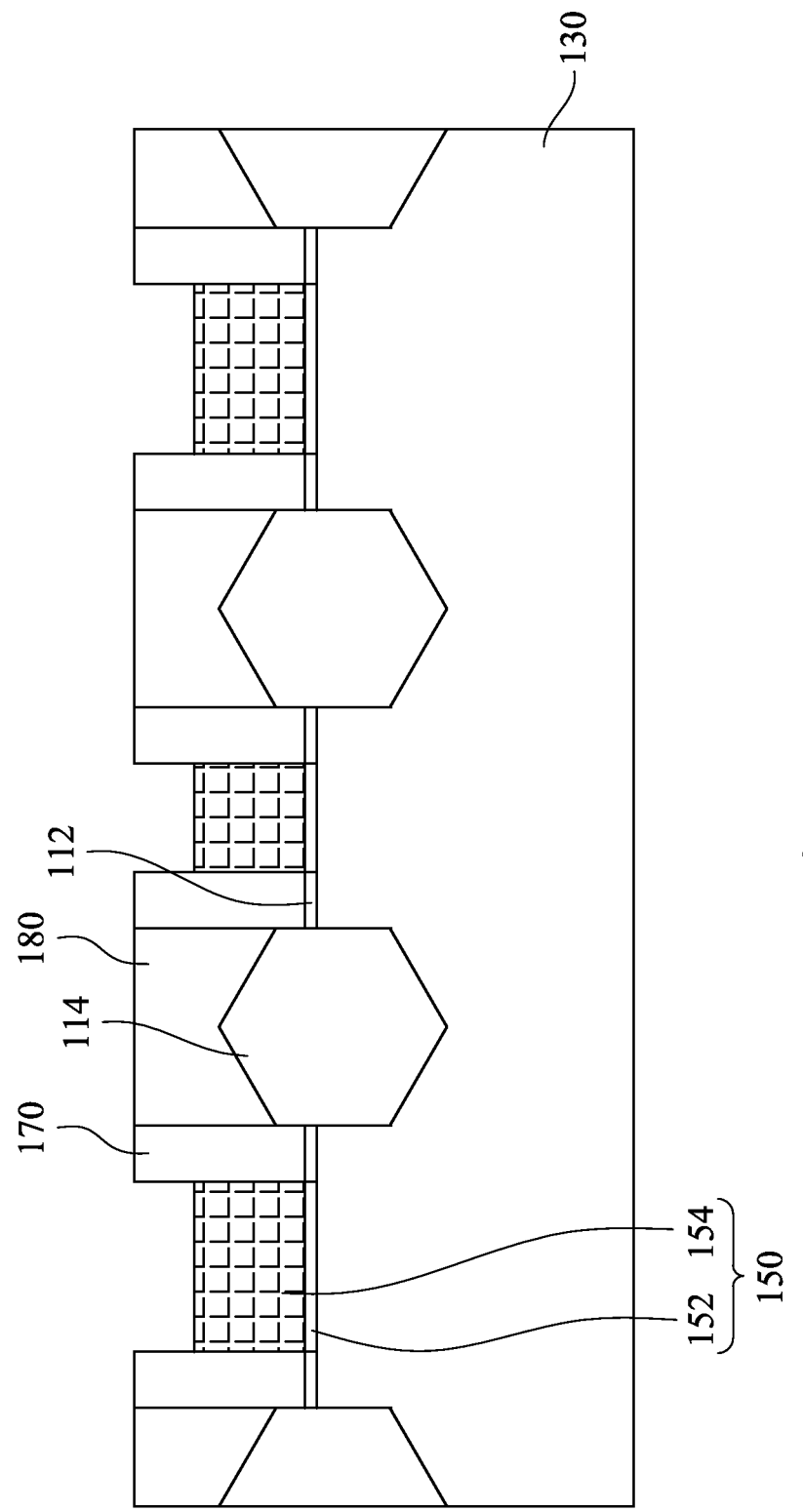
Figure 7B:
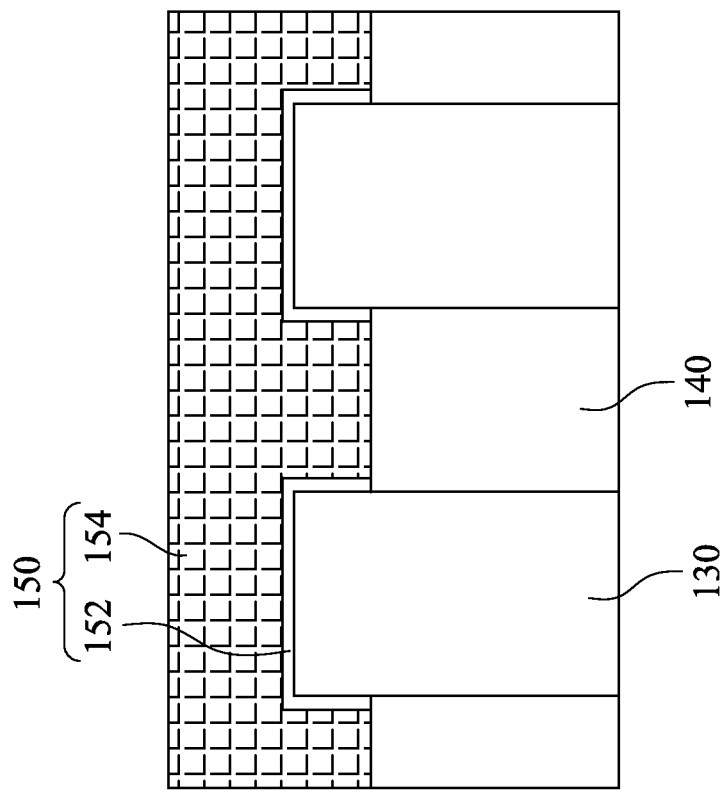

Referring to FIG. 7A and FIG. 7B, the dummy gate stacks 310 are replaced with the HK/MG stack 150. First, the dummy gate stacks 310 and the gate oxide 112 between the dummy gate stacks 310 and the fin structure 130 are removed. The dummy gate stacks 310 are removed to form gate trenches, and the gate oxide 112 exposed in the gate trenches is removed. The dummy gate stacks 310 and the gate oxide 112 may be removed by an etch process (such as selective wet etch or selective dry etch) designed to have an adequate etch selectivity. In embodiments, the etch process may include one or more etch steps with respective etchants.

Second, the HK/MG stacks 150 are formed in the gate trenches. As shown in FIG. 7A and FIG. 7B, HK/MG stacks 150 are formed in the gate trenches to wrap over the fin structures 130, which the HK/MG stack 150 includes the high-k dielectric layer 154 and the metal gate 152 on the high-k dielectric layer 154. In embodiments, the high-k dielectric layer 154 includes a dielectric material layer having a high dielectric constant, and the metal gate 152 includes metal, metal alloy or metal silicide.

It is worth noting that, the HK/MG stack 150 does not fully fill the gate trenches, a top surface of the HK/MG stack 150 is below a top surface of the neighbor sidewall spacer 170. Different methods could be applied to lower the top surface of the HK/MG stack 150. In embodiments, the dummy gate stacks 310 and the gate oxide 112 are removed by the etch process, and the isolation structures 140 exposed in the gate trenches are also etched in the same etch process to reduce a thickness of the isolation structures 140. Therefore, the HK/MG stack 150 could be deposited on the isolation structures 140 with the reduced thickness, and the top surface of the HK/MG stack 150 could be below a top surface of the neighbor sidewall spacer 170. In various embodiments, the HK/MG stack 150 is deposited to fully fill the gate trenches, and another etch process is applied to remove a portion of the HK/MG stack 150. In various embodiments, controlling the deposition process to form the HK/MG stack 150 not filling the gate trenches.

In one embodiment, before depositing the high-k dielectric layer 154, an interfacial layer (IL) is deposited on the fin structure 130 by a suitable method, such as atomic layer deposition (ALD), CVD, thermal oxidation or ozone oxidation. The IL includes oxide, HfSiO and oxynitride. A high-k dielectric layer 154 is deposited on the IL by a suitable technique, such as ALD, CVD, metal-organic CVD (MOCVD), physical vapor deposition (PVD), other suitable technique, or a combination thereof. The high-k dielectric layer 154 may include LaO, AlO, ZrO, TiO, Ta2O5, Y2O3, SrTiO3 (STO), BaTiO3 (BTO), BaZrO, HfZrO, HfLaO, HfSiO, LaSiO, AlSiO, HfTaO, HfTiO, (Ba,Sr)TiO3 (BST), Al2O3, Si3N4, oxynitrides (SiON), or other suitable materials.

In various embodiments, the metal gate 152 may include tungsten (W), titanium (Ti), tantalum (Ta), aluminum (Al), nickel (Ni), ruthenium (Ru), palladium (Pd), platinum (Pt), tungsten nitride (WNx), titanium nitride (TiN), tantalum nitride (TaN), aluminum nitride (AlN), tungsten silicide (WSix), nickel silicide (Ni2Si), titanium silicide (TiSi2), titanium aluminide (TiAl), an alloy thereof, and combinations thereof. The metal gate 152 may be formed by ALD, PVD, CVD, or other suitable processes.

Figure 8A:
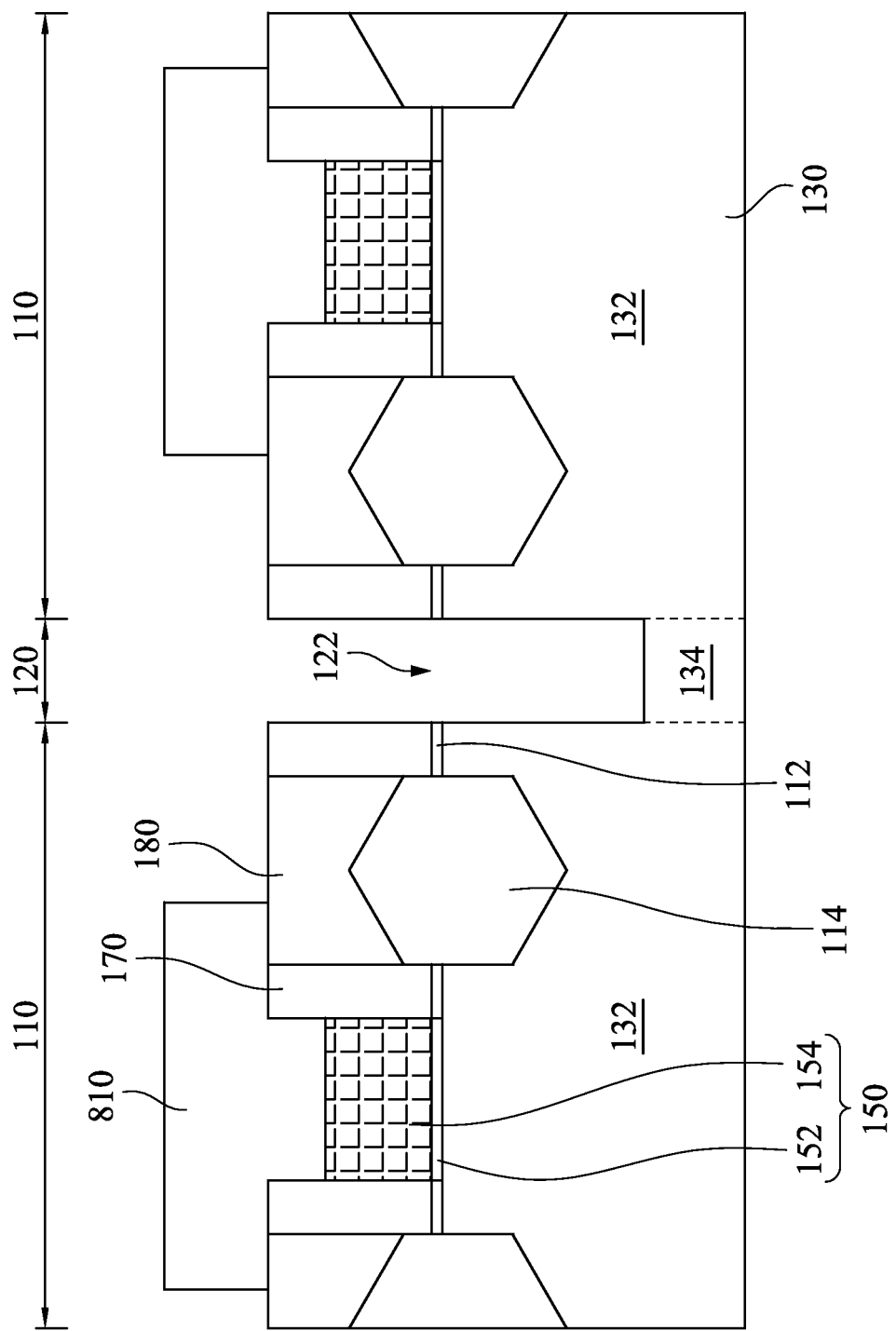

Referring to FIG. 8A and FIG. 8B, the HK/MG stack 150 and the fin structures 130 in the channel-isolation region 120 are removed. A patterned photoresist 810 is applied to cover the HK/MG stacks 150 in the active region 110, which the HK/MG stack 150 in the channel-isolation region 120 is exposed. Then, the exposed HK/MG stack 150 and the fin structures 130 in the channel-isolation region 120 are removed through the patterned photoresist 810. To avoid metal residues migrating to the active region 110, the fin structure 130 should be further etched to remove these metal residues. As shown in FIG. 8B, the etching process removes a protruding part of the fin structure 130 in the channel-isolation region 120, and further recessing the fin structure 130 corresponding to a top surface of the isolation structure 140. The recessed structure 122 will be formed on the second portion 134 of the fin structure 130 at the channel-isolation region 120, which a bottom of the recessed structure 122 is lower than the top surface of the isolation structure 140.

In embodiments, although the etching process further recesses the fin structure 130 corresponding to a top surface of the isolation structure 140 to remove the metal residues, some metal residues may remained on sidewalls and a bottom of the recessed structure 122.

In various embodiments, the patterned photoresist 810 may be fabricated by photoresist layer coating (e.g., spin-on coating), soft baking, mask aligning, exposure, post-exposure baking, developing the photoresist layer, rinsing, drying (e.g., hard baking), other suitable processes, and/or combinations thereof. In some embodiments, the HK/MG stack 150 and the fin structure 130 in the channel-isolation region 120 are removed by a dry etching process. The dry etching process may include a biased plasma etching process that uses a chlorine gas ($Cl_2$), boron trichloride ($BCl_3$), argon (Ar). Other dry etching gasses include CF4, NF3, SF6, and He. Dry etching may also be performed anisotropically using such mechanisms as DRIE (deep reactive-ion etching).

In embodiments, the bottom of recessed structure 122 is in a range from about 1 angstrom to about 2000 angstroms below the top surface of the isolation structure 140. In various embodiments, the bottom of recessed structure 122 is in a range from about 100 angstrom to about 200 angstroms below the top surface of the isolation structure 140.

Figure 9A:
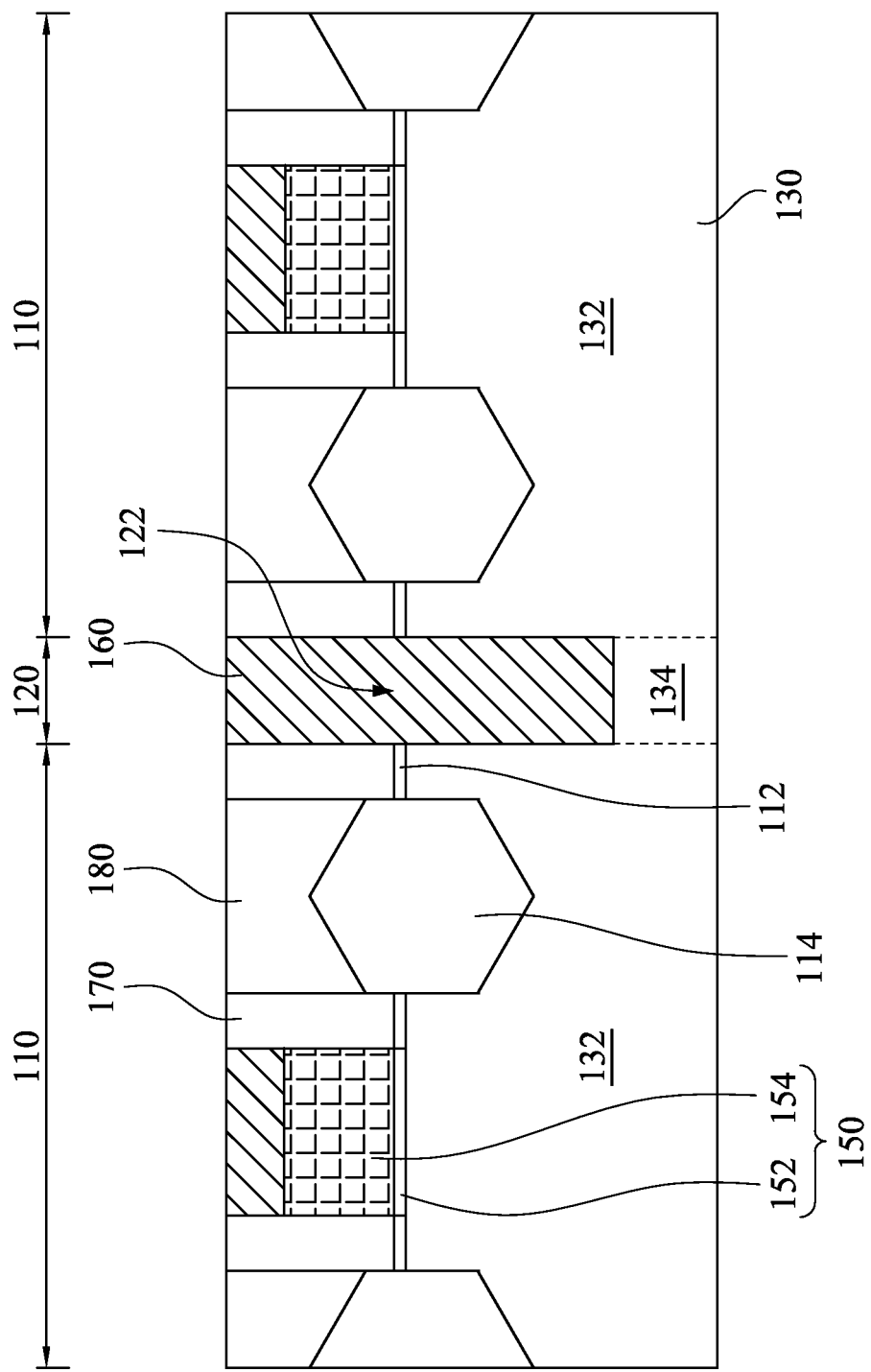
Figure 9B:
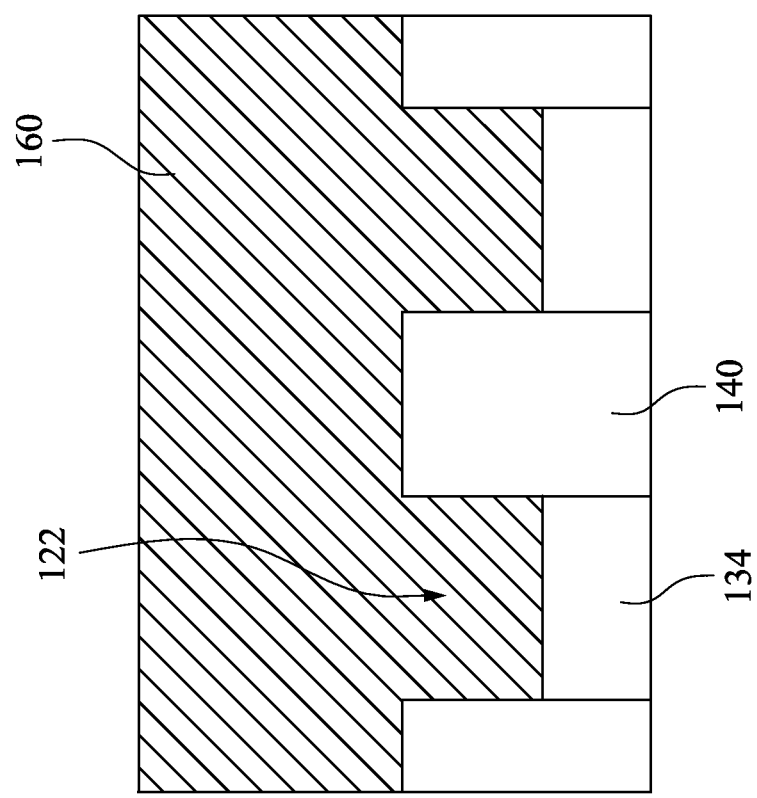

Continuing in FIG. 9A and FIG. 9B, the patterned photoresist 810 is stripped, and the passivation layer 160 is formed to cover the HK/MG stack 150 in the active regions 110 and filling the channel-isolation region 120. First, the patterned photoresist 810 is stripped by any suitable solvents, e.g., acetone, and the passivation layer 160 is deposited on the substrate, including conformably wrapping over HK/MG stack 150 in the active regions 110 and filling the channel-isolation structure 120. The passivation layer 160 in the active regions 110 protects the HK/MG stack 150 from moisture or particles invading. Besides, the passivation layer 160 in the channel-isolation region 120 separates two active regions 110 and ensures the HK/MG stacks 150 in the active regions 110 are electrically isolated.

As aforementioned, the general method performs two deposition processes and two chemical machine polish (CMP) processes to fabricate the passivation layer 160 in the active regions 110 and the channel-isolation region 120. It is worth noticed that, in the present disclosure, the passivation layer 160 in the active regions 110 and the passivation layer 160 in the channel-isolation region 120 are formed at a same deposition process. Therefore, the Fin-FET device 100 could be fabricated with reduced deposition process, and the chemical machine polish (CMP) process could be performed only once to remove excessive passivation layer 160.

In embodiments, the passivation layer 160 may include silicon oxide, silicon nitride, silicon oxynitride, silicon carbon nitride, spin-on-glass, spin-on-polymer, or other suitable materials, or combinations thereof. The passivation layer 160 may be deposited by CVD, physical vapor deposition (PVD), ALD, thermal oxidation, spin-on coating, or other suitable techniques, or a combination thereof.

The embodiments of the present disclosure discussed above have advantages over existing Fin-FET devices and processes of manufacturing Fin-FET devices, and the advantages are summarized below. The dummy gate stacks in the active region and the channel-isolation region are replaced with the HK/MG stacks, and the HK/MG stack in the channel-isolation region is removed. The passivation layer could be formed in the active region and the channel-isolation region at a same deposition process, and accompanied with only one CMP process. Therefore, the present disclosure provides a method of manufacturing the Fin-FET device without extra costs for the deposition process and the CMP process, and thus enhances the efficiency of the process.

Besides, the fin structure in the channel-isolation region is further recessed corresponding to the top surface of the isolation structure. The metal residues could be removed to avoid affecting the active region, and the performance of the Fin-FET device will become more stable.

In accordance with some embodiments, the present disclosure discloses a fin-like field-effect transistor (Fin-FET) device includes a substrate, a fin structure disposed on the substrate, and an isolation structure disposed adjacent to the fin structure. The fin structure includes a recessed structure, which a bottom of the recessed structure is below a top surface of the isolation structure.

In accordance with various embodiments, the present disclosure discloses a in-like field-effect transistor (Fin-FET) device includes two active regions and a channel-isolation region interposed between the two active regions. The active region includes a first portion of a fin structure, an isolation structure adjacent to the fin structure, a high-k/metal gate stack on the first portion of fin structure and a passivation layer on the high-k/metal gate stack. The channel-isolation region includes a second portion of the fin structure having a recessed structure, the isolation structure adjacent to the fin structure and the passivation layer filling the channel-isolation region, which a bottom of the recessed structure is below a top surface of the isolation structure.

In accordance with various embodiments, the present disclosure discloses a method of manufacturing a fin-like field-effect transistor (Fin-FET) device. The method begins with forming dummy gate stacks on a fin structure and an isolation structure, and the dummy gate stacks are replaced with high-k/metal gate stacks. One of the high-k/metal gate stacks is exposed and being removed, and the fin structure is recessed corresponding to a top surface of the isolation structure. A passivation layer is formed on the high-k/metal gate stacks and the recessed fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin-like field-effect transistor (Fin-FET) device, comprising:
   a substrate;

a fin structure disposed on the substrate and having a recessed structure;

an isolation structure disposed adjacent to the fin structure, and a bottom of the recessed structure being in the fin structure and below a top surface of the isolation structure;

a high-k/metal gate stack on the fin structure; and sidewall spacers on both sides of the high-k/metal gate stack, wherein a top surface of the high-k/metal gate stack is lower than a top surface of the sidewall spacers.

2. The Fin-FET device of claim 1, wherein the bottom of the recessed structure is in a range from about 1 angstrom to about 2000 angstroms below the top surface of the isolation structure.

3. The Fin-FET device of claim 2, wherein the bottom of the recessed structure is in a range from about 100 angstroms to about 200 angstroms below the top surface of the isolation structure.

4. The Fin-FET device of claim 1, wherein the recessed structure has a symmetrical profile.

5. The Fin-FET device of claim 1, further comprising a passivation layer on the recessed structure.

6. A fin-like field-effect transistor (Fin-FET) device, comprising:

two active regions, each of the two active regions comprising:
a first portion of a fin structure;
an isolation structure adjacent to the fin structure;
a high-k/metal gate stack on the first portion of the fin structure;
sidewall spacers on both sides of the high-k/metal gate stack, wherein a top surface of the high-k/metal gate stack is lower than a top surface of the sidewall spacers; and
a passivation layer above the high-k/metal gate stack; and a channel-isolation region interposed between the two active regions, the channel-isolation region comprising:
a second portion of the fin structure having a recessed structure;
the isolation structure adjacent to the fin structure, wherein a bottom of the recessed structure is below a top surface of the isolation structure; and
the passivation layer filling the channel-isolation region.

7. The Fin-FET device of claim 6, further comprising a first epitaxial structure in one of the two active regions and a second epitaxial structure in another of the two active regions, wherein the first and second epitaxial structures are disposed at opposite sides of the recessed structure.

8. The Fin-FET device of claim 7, further comprising an interlayer dielectric (ILD) layer covering the first and second epitaxial structures.

9. The Fin-FET device of claim 6, wherein the bottom of the recessed structure is in a range from about 1 angstroms to about 2000 angstroms below the top surface of the isolation structure.

10. The Fin-FET device of claim 9, wherein the bottom of the recessed structure is in a range from about 100 angstroms to about 200 angstroms below the top surface of the isolation structure.

11. A method of manufacturing a fin-like field-effect transistor (Fin-FET) device, comprising:
forming dummy gate stacks on a fin structure and an isolation structure;
replacing the dummy gate stacks with high-k/metal gate stacks;
exposing one of the high-k/metal gate stacks;
removing the exposed high-k/metal gate stack;
recessing the fin structure corresponding to a top surface of the isolation structure; and
forming a passivation layer on the high-k/metal gate stacks and the recessed fin structure.

12. The method of claim 11, after forming dummy gate stacks on the fin structure and the isolation structure, further comprising:
forming sidewall spacers on both sides of the dummy gate stack;
growing epitaxial structures on the fin structure; and
forming an interlayer dielectric (ILD) layer covering the epitaxial structures.

13. The method of claim 12, wherein replacing the dummy gate stacks with high-k/metal gate stacks comprises:
removing the dummy gate stack to form a gate trench between the sidewall spacers; and
forming the high-k/metal gate stack in the gate trench.

14. The method of claim 13, wherein forming the high-k/metal gate stack comprises:
forming a high-k dielectric layer on the fin structure; and
forming a metal gate on the high-k dielectric layer.

15. The method of claim 12, wherein a top surface of the exposed high-k/metal gate stack is lower than a top surface of the sidewall spacers.

16. The method of claim 11, wherein removing the exposed high-k/metal gate stack and recessing the fin structure are by performing an etching process.

17. The method of claim 16, wherein the etching process is a dry etching process using $Cl_2$, $BCl_3$, Ar, $CF_4$, $NF_3$, $SF_6$, He, or combination thereof.

18. The method of claim 11, further comprising forming a patterned photoresist to expose one of the high-k/metal gate stacks.

19. The method of claim 11, further comprising using a chemical mechanical polish (CMP) process to planarize the Fin-FET device after forming the passivation layer.

* * * * *